(12) United States Patent
Stewart et al.

(10) Patent No.: US 9,472,634 B2
(45) Date of Patent: Oct. 18, 2016

(54) ALL AROUND CONTACT DEVICE AND METHOD OF MAKING THE SAME

(71) Applicants: Eric J Stewart, Silver Spring, MD (US); Howell George Henry, Ellicott City, MD (US); Robert S. Howell, Silver Spring, MD (US); Matthew Russell King, Linthicum, MD (US); Justin Andrew Parke, Ellicott City, MD (US); Bettina Nechay, Laurel, MD (US); Harlan Carl Cramer, Columbia, MD (US); Ronald G Freitag, Catonsville, MD (US); Karen Marie Renaldo, Pasadena, MD (US)

(72) Inventors: Eric J Stewart, Silver Spring, MD (US); Howell George Henry, Ellicott City, MD (US); Robert S. Howell, Silver Spring, MD (US); Matthew Russell King, Linthicum, MD (US); Justin Andrew Parke, Ellicott City, MD (US); Bettina Nechay, Laurel, MD (US); Harlan Carl Cramer, Columbia, MD (US); Ronald G Freitag, Catonsville, MD (US); Karen Marie Renaldo, Pasadena, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/065,298

(22) Filed: Mar. 9, 2016

(65) Prior Publication Data

US 2016/0190267 A1   Jun. 30, 2016

Related U.S. Application Data

(62) Division of application No. 14/459,006, filed on Aug. 13, 2014.

(51) Int. Cl.
*H01L 29/06* (2006.01)
*H01L 29/423* (2006.01)
*H01L 29/20* (2006.01)
*H01L 29/778* (2006.01)

(52) U.S. Cl.
CPC ..... *H01L 29/42316* (2013.01); *H01L 29/0657* (2013.01); *H01L 29/2003* (2013.01); *H01L 29/7783* (2013.01)

(58) Field of Classification Search
None
See application file for complete search history.

(56) References Cited

U.S. PATENT DOCUMENTS 4,799,087 A * 1/1989 Matsuyama ......... B82Y 10/00
257/16
8,129,800 B2   3/2012 Yun et al.
(Continued)

OTHER PUBLICATIONS

Chu, et al.: "*AlGaN—GaN Double-Channel HEMTs*", IEEE Transactions on Electron Devices, vol. 52, No. 4, Apr. 2005, pp. 438-446.
(Continued)

*Primary Examiner* — Ali Naraghi
(74) *Attorney, Agent, or Firm* — Tarolli, Sundheim, Covell & Tummino LLP

(57) ABSTRACT

A device is provided that comprises a first pillar disposed in a first region and overlying a base structure, and a second pillar disposed in a second region and overlying the base structure and being spaced apart from the first pillar by a device region. A bridge is disposed in the device region with a first end connected to the first pillar and a second end connected to the second pillar. The bridge includes a top, sides, and a bottom. The bridge is formed from one or more heterostructures with an undercut opening extending from the bottom to an underlying structure. A four-sided conductive contact wraps around and substantially surrounds the bridge around its top, its sides, and its bottom along at least a portion of its length between the first and second end.

11 Claims, 7 Drawing Sheets

(56) References Cited

U.S. PATENT DOCUMENTS

| | | |
|---|---|---|
| 8,338,860 B2 | 12/2012 | Bhalla et al. |
| 2005/0285098 A1 | 12/2005 | Fathimulla et al. |
| 2014/0264273 A1 | 9/2014 | Howell et al. |
| 2014/0291772 A1 | 10/2014 | Rachmady et al. |
| 2016/0049473 A1* | 2/2016 | Stewart ............. H01L 29/42316 257/20 |
| 2016/0126340 A1* | 5/2016 | Nechay ............... H01L 29/7783 257/20 |

OTHER PUBLICATIONS

Stonas, et al.: *"Photoelectrochemical Undercut Etching for Fabrication of GaN Microelectromechanical Systems"*, J. Vac. Sci. Techno. B 19(6), Nov./Dec. 2001, 2001 American Vacuum Society, pp. 2838-2841.

\* cited by examiner

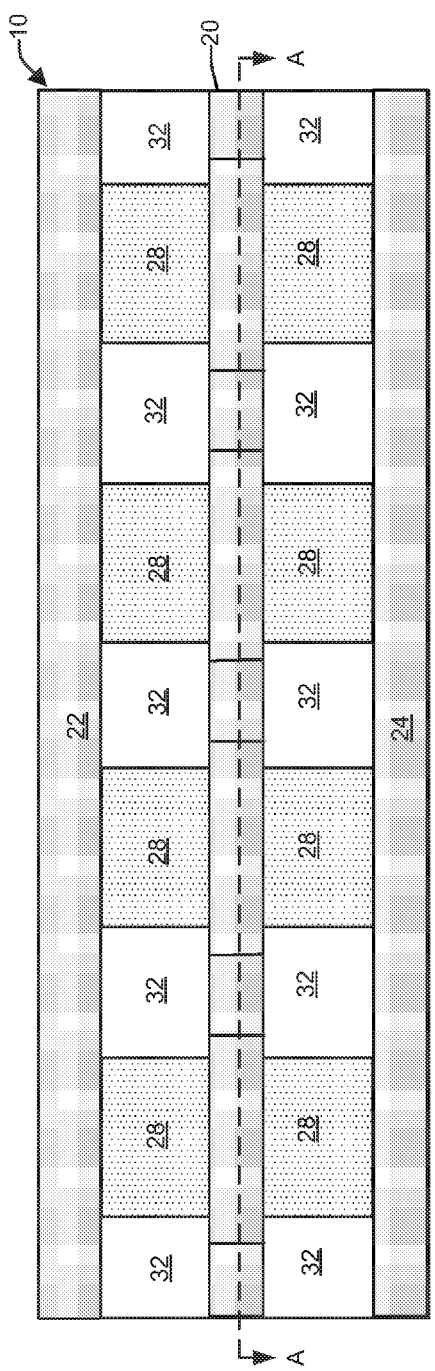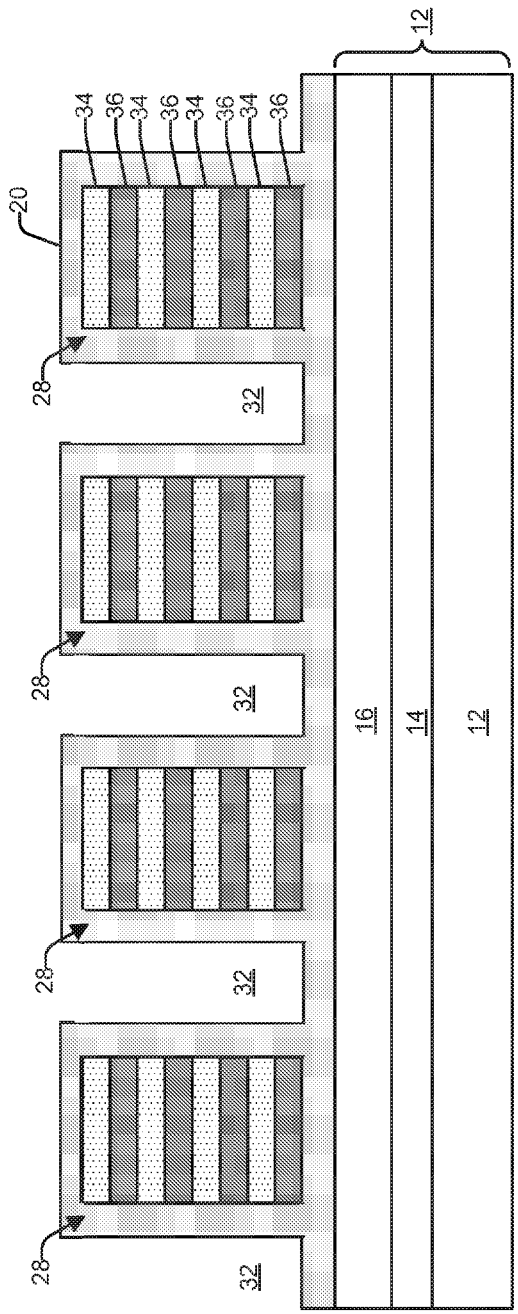
FIG. 1
FIG. 2

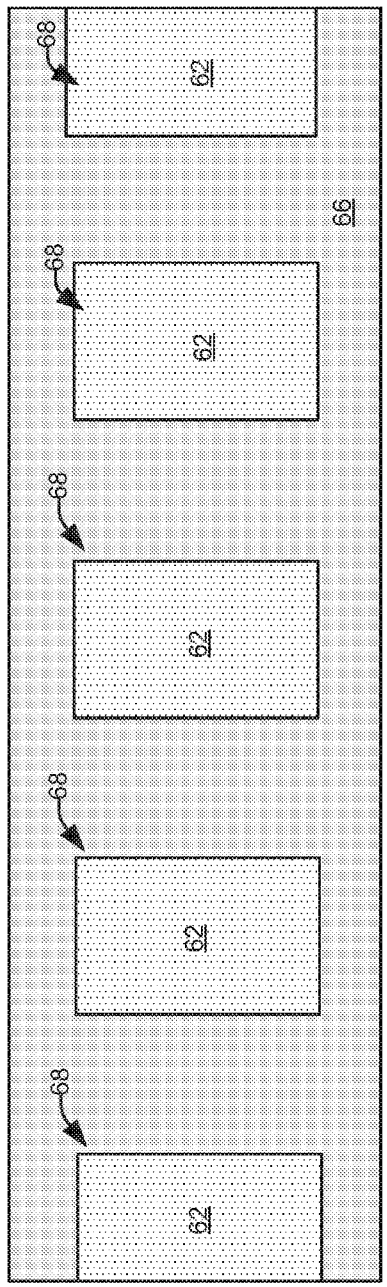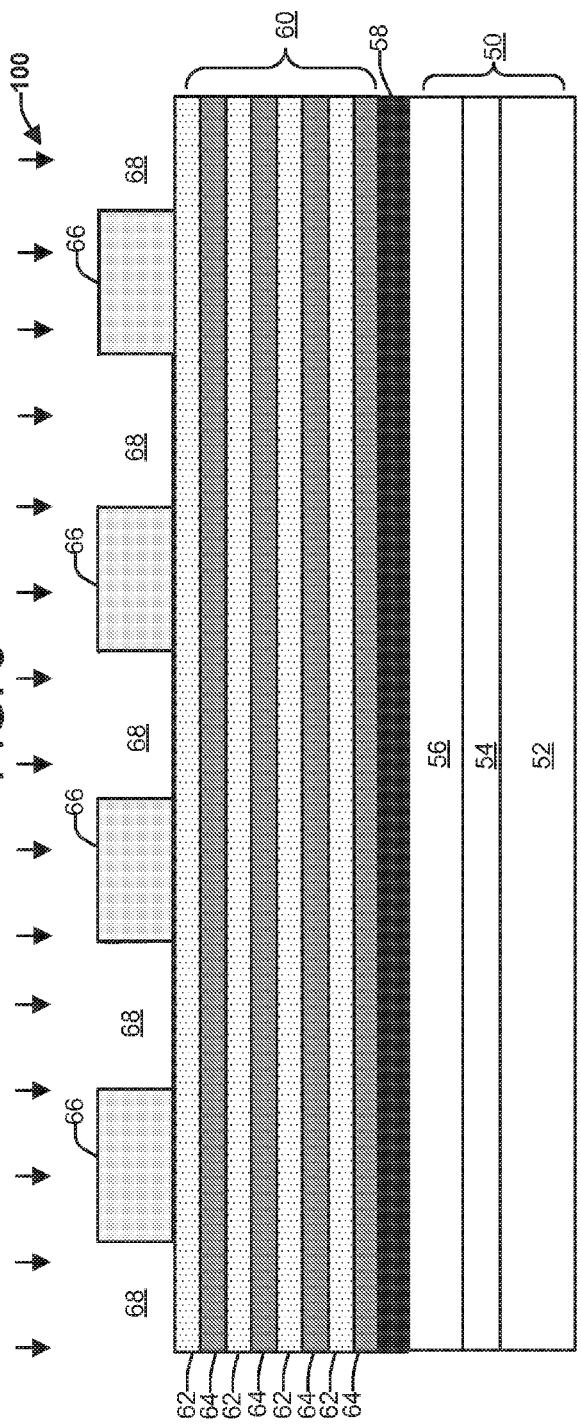

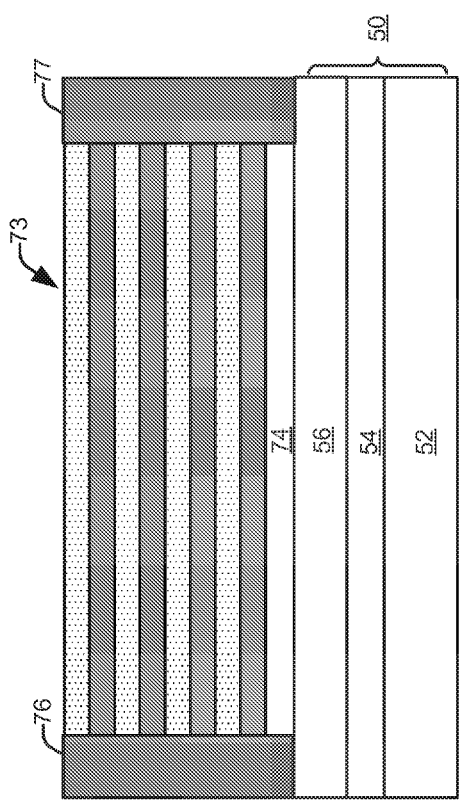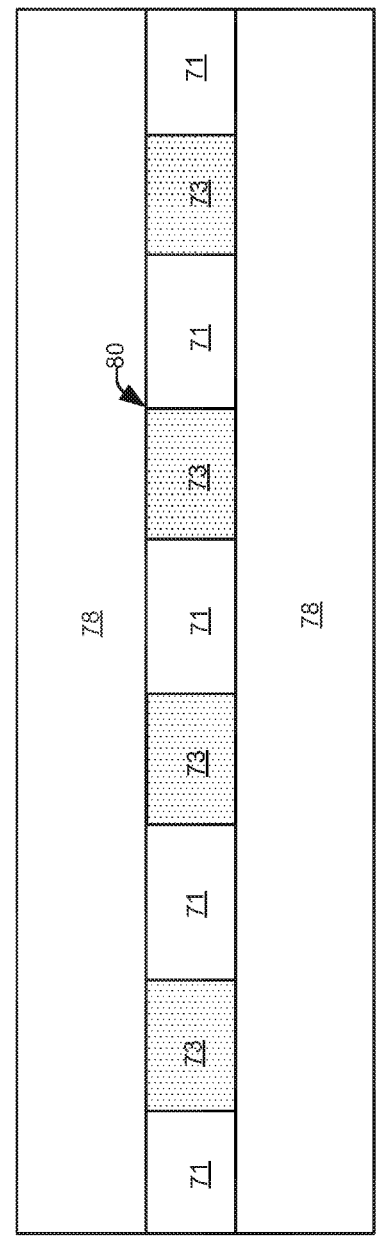

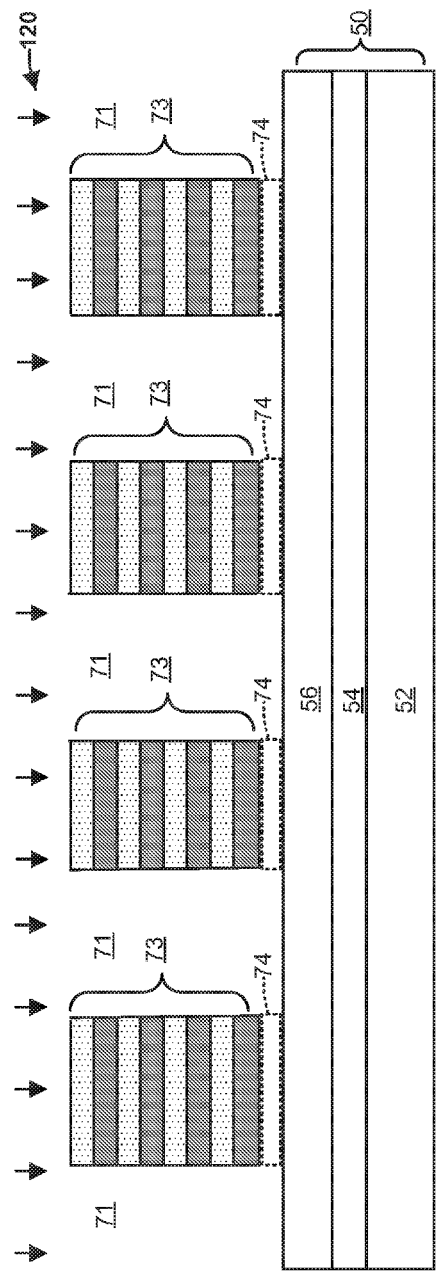
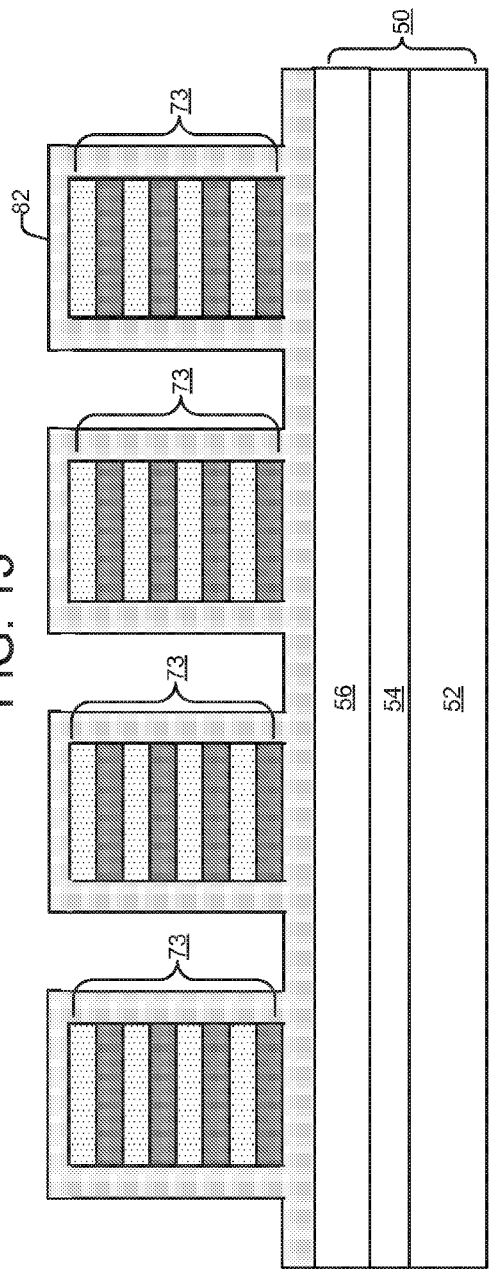
FIG. 13
FIG. 14

ALL AROUND CONTACT DEVICE AND METHOD OF MAKING THE SAME

RELATED APPLICATIONS

This application is a divisional of U.S. patent application Ser. No. 14/459,006, filed 13 Aug. 2014, entitled "All Around Contact Device and Method of Making the Same" to Stewart, et al., the entirety of which is incorporated herein by reference.

TECHNICAL FIELD

The present invention relates generally to electronics, and more particularly to an all around contact device and method of making the same.

BACKGROUND

Presently, solid-state devices are limited in their ability to deliver power at Terahertz (THz) frequencies. Device that exhibit good gain at high frequency (0.5-1 THz), such as Indium Phosphide (InP) Heterojunction Bipolar Transistors (HBTs) and Indium Aluminum Arsenide (InAlAs) Metamorphic High Electron Mobility Transistors (mHEMTs), sacrifice operating voltage to achieve this, and therefore run at very low voltage (<2 V) and low power. Conventional Gallium Nitride (GaN) devices can deliver high operating voltage (5-15 V) and therefore high power, but are restricted to lower frequencies (<0.4 THz) due to low gain. Conventionally, to achieve high Field Effect Transistor (FET) gain at high frequency, device designers will scale the device gate length (Lg) to very small values to reduce gate-source capacitance and increase transconductance. In addition, the gate-source and gate-drain dimensions are also made small to minimize parasitic access resistances. Both of these approaches have significant drawbacks. A small Lg is susceptible to short channel effects, which can severely limit the three-terminal operating voltage. Small gate-source and gate-drain spacing also reduces operating voltage through a reduction in the two-terminal breakdown voltage. Both techniques will reduce yield by making the device much harder to manufacture.

Certain heterostructure materials, such as Aluminum Gallium Nitride (AlGaN) and GaN, create an electron well (i.e., a sheet of electrons) at the interface between the two dissimilar materials resulting from the piezoelectric effect and spontaneous polarization effect therebetween. The resulting sheet of electrons that forms at this interface is typically referred to as a Two-Dimensional Electron Gas ("2DEG") channel. Equally applicable is a superlattice structure having a plurality of two-dimensional hole gas (2DHG) channels. Both types of structures can be referred to as "2D×G channel(s)" devices. FETs that operate by generating and controlling the electrons in the 2D×G channel are conventionally referred to as high electron mobility transistors ("HEMTs").

By stacking a plurality of these two-material heterostructures, and with the addition of appropriate doping in the layers to maintain the presence of the 2D×G channels when stacking a plurality of heterostructure layers, the electron sheets are able to act in parallel, allowing for greater current flow through the superlattice device. When this type of FET is "on", the superlattice device has a lower on-resistance, relative to a single heterostructure-layer device, because the multiple 2DEG channels allow a proportionally higher current to flow between the source and drain, resulting in an overall reduction in on-resistance. This type of structure has been well suited for providing an ultra low channel resistance high frequency switch. However, they are not as ideally suited for forming highly linear amplifiers.

SUMMARY

All around conductive contact devices are disclosed and methods of making the same. In one example, a device is provided that comprises a first pillar disposed in a first region and overlying a base structure, and a second pillar disposed in a second region and overlying the base structure and being spaced apart from the first pillar by a device region. A bridge is disposed in the device region with a first end connected to the first pillar and a second end connected to the second pillar. The bridge includes a top, sides, and a bottom. The bridge is formed from one or more heterostructures with an undercut opening extending from the bottom to an underlying structure. A four-sided conductive contact wraps around and substantially surrounds the bridge around its top, its sides, and its bottom along at least a portion of its length between the first and second end.

In accordance with yet another example, a transistor device is provided that comprises a first pillar disposed in a drain region and overlying a base structure, a second pillar disposed in a source region and overlying the base structure and being spaced apart from the first pillar by a channel region, and a multichannel bridge disposed in the channel region with a first end connected to the first pillar and a second end connected to the second pillar, the multichannel bridge being formed from a plurality of heterostructures. The transistor device further comprise a four-sided gate contact that wraps around and substantially surrounds the multichannel bridge along at least a portion of its length.

In one example, a method is provided of forming a transistor device. The method comprises depositing a sacrificial layer over a base structure, forming a superlattice structure comprising a plurality of heterostructures over the sacrificial layer, and etching away openings in the superlattice structure over a channel region to form a multichannel ridge. The method further comprises etching away a portion of the sacrificial layer over the channel region to extend the openings to the base structure and to form an undercut opening on a bottom surface of the multichannel ridge to form a multichannel bridge, and performing a gate contact fill process to form a wrap around gate contact that substantially surrounds the multichannel bridge along at least a portion of its length.

BRIEF DESCRIPTION OF THE DRAWINGS

FIG. 1 illustrates a plan view of an example of an all around gate field effect transistor (AAGFET).

FIG. 2 illustrates a cross-sectional view of the structure of FIG. 1 along its center line A-A.

FIG. 5 illustrates a plan view of the structure of FIG. 4.

FIG. 6 illustrates a cross-sectional view of the structure of FIG. 5 undergoing a first etch process.

FIG. 11 illustrates a right side view of the structure of FIG. 9.

FIG. 12 illustrates a plan view of the structure of FIG. 11 after undergoing a photoresist material layer deposition and patterning process.

FIG. 13 illustrates a cross-sectional view of the structure of FIG. 12 undergoing a gate contact fill deposition.

FIG. 14 illustrates a cross-sectional view of the structure of FIG. 13 after undergoing the gate contact fill deposition.

DETAILED DESCRIPTION

Figure 3:
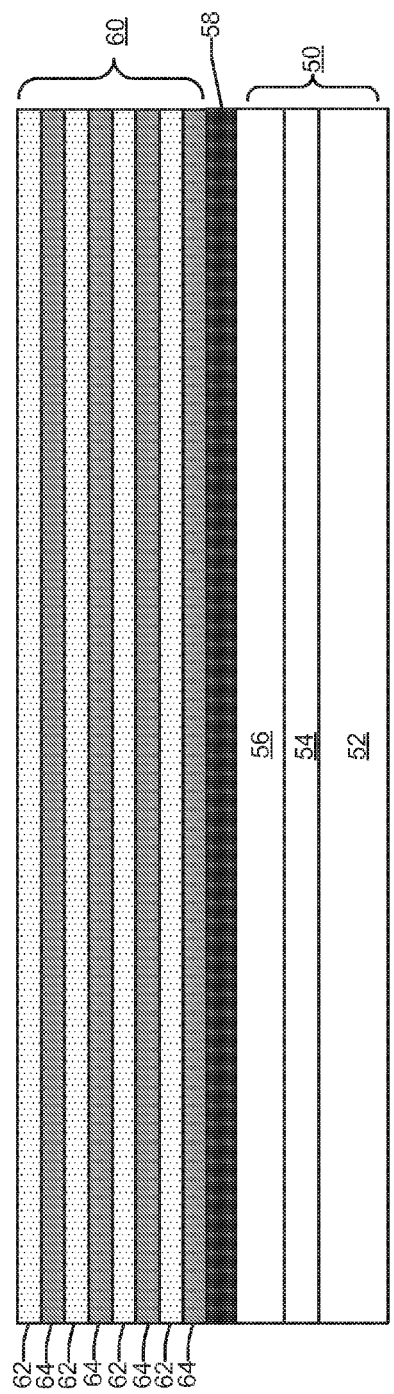
FIG. 3 illustrates a cross-sectional view of an epitaxial structure in its early stages of fabrication.

All around conductive contact devices are disclosed and methods of making the same. The all around conductive contact devices can include transistor devices, resonators, light emitting diodes, and laser diodes in addition to a number of other devices. In one example, a device includes a bridge with a first end and a second end disposed in a device regions. The bridge is formed from one or more heterostructures and includes a top, a first and second side and a bottom. An undercut opening extends between the bridge and a base structure. A four-sided conductive contact wraps around and substantially surrounds the bridge around its top, its first side, its second side and its bottom along at least a portion of its length between the first and second end.

In one example, an all around gate transistor (AAGT) device and method of making the same is disclosed. An example of AAGT device is a multi-channel all around gate field effect transistor (AAGFET). This device combines a super lattice multi-channel epitaxial structure with a wrap-around-gate to create an extremely high-power, high-frequency transistor. The multi-channel epitaxy provides a very low channel resistance, enabling ultra-low parasitic resistance without the extreme geometry scaling that can limit device operating voltage. The all-around-gate provides superior pinch off characteristics, high transconductance, and high values of output impedance that can enable high frequency performance without deterioration from short channel effects (SCE). The AAGFET is estimated to provide a critical frequency performance figure of merit, $F_{max}$, combined with a high operating voltage. As such, the AAGFET holds the potential for high-power amplification into the THz range. Integration of AAGFETs designed for power, low noise, and switching on the same wafer will be feasible as well as integration with conventional Gallium Nitride (GaN) devices on a single chip.

The AAGFET is a solid-state device that can provide both gain amplification and high power at Terahertz frequencies. Solid state devices are desirable sources due to their high reliability, manufacturability, and low size, weight, and cost. Traditional solid-state devices, however, have either the ability to deliver high power at low frequency (<0.2 THz), or low power at high-frequency (>0.5 THz), but not both. The AAGFET device enables simultaneous power and frequency performance due to its GaN superlattice channel and advanced three-dimensional gate structure.

Substantial performance benefit can be obtained from such a structure. AAGFETs will make frequencies accessible to wide band gap GaN/Aluminum Gallium Nitride (AlGaN) FETs with higher voltage operation than the incumbent Indium Phosphide (InP)-based THZ technology. $F_{max}$ is defined as the frequency at which a device's Maximum Available Gain (MAG) goes to 0 dB, and is a figure of merit for frequency capability. By choosing a frequency of operation at $\frac{1}{2}F_{max}$, a designer can be assured of 6 dB MAG. A critical metric that can be improved with the AAGFET structure is the output impedance, $R_o$. This can be made much higher due to the ability of the gate to control the channel from four sides and therefore almost eliminate short channel effects.

As an example, an AAGFET structure described herein includes a multichannel device composed of a plurality of aluminum gallium nitride (AlGaN)/gallium nitride (GaN) heterojunction layers of a prescribed thickness and composition, which is known as an AlGaN/GaN superlattice, formed on a single substrate. A 2-dimensional electron gas (2DEG) forms at the interface between the AlGaN and GaN layers resulting in high electron mobility. Equally applicable is a superlattice structure having a plurality of two-dimensional hole gas (2DHG) channels. Both types of structures can be referred to as "2D×G channel(s)" devices.

Example methods of fabrication involve sequential growth of multichannel profiles in a monolithic epitaxial scheme. By sequentially growing the epitaxial multichannel devices, all devices fabricated from this structure will benefit from the inherently high quality material properties, atomically flat interfaces and compositional control associated with epitaxial growth.

Carriers which form a 2DEG in a standard channel of AlGaN/GaN HFET are spontaneously generated and maintained due to piezoelectric and spontaneous polarization. In this case, the AlGaN barrier is strained by virtue of its epitaxial relationship with the GaN channel and since these materials are piezoelectric, free carriers are generated in the channel. In contrast, gallium arsenide (GaAs) and its aluminum based alloy AlGaAs can maintain a 2DEG; however, they are not piezoelectric and therefore require doping to induce an appreciable 2DEG concentration. Since carrier concentration in AlGaN/GaN heterostructures is controlled largely by the composition of barrier and channel layers, the present examples disclose that the AAGFET structure can be created through precise control of composition, thickness and order of AlGaN and GaN layers. An epitaxial scheme and device fabrication method is provided that exploits this phenomenon which is unique to the GaN-based material system, and allows for fabrication of high linearity FETs and low loss RF switches.

The illustrations of FIGS. 1-16 refer to examples of an AAGFET device structure and a method of making an AAGFET device structure. However, a variety of other all around conductive conduct structures and methods of making such structures are applicable to one or more aspects of the present invention.

Figure 10:
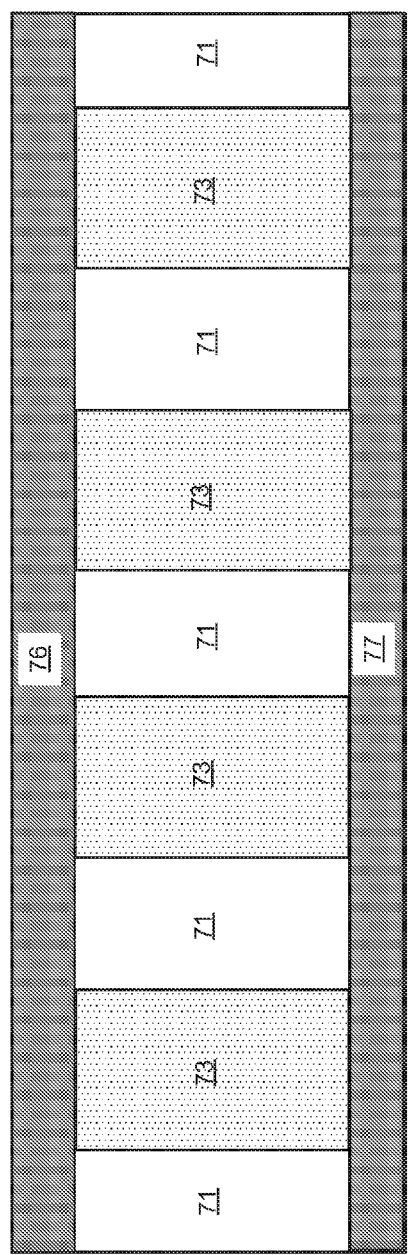
FIG. 10 illustrates a plan view of the structure of FIG. 9.

FIG. 1 illustrates a plan view of an example of an AAGFET device structure 10. The device structure 10 includes a wrap around gate 20 that substantially surrounds a plurality of superlattice structure ridges (multichannel ridges) 28 formed from plurality of heterostructures of an AlGaN layer 34 overlying a GaN layer 36. FIG. 2 illustrates a cross-sectional view (planar slice) of the structure of FIG. 1 along its longitudinal center line A-A. Each GaN layer 36 of the heterostructures can have a thickness of about 5 nm to about 20 nm (e.g., 10 nm) and each AlGaN layer 34 can have a thickness of about 5 nm to about 15 nm (e.g., 7 nm). The wrap around gate 20 is formed in a central longitudinal portion of a channel region that extends along at least a portion of the length of the plurality of superlattice structure ridges 28 formed between castellated trench openings 32 that form non-channel openings. Each of the superlattice structure extends between a first pillar (not shown) that extends longitudinally underneath a drain contact 22 and a second pillar (not shown) that extends longitudinally underneath a source contact 24. An example of a first and second pillar is shown in FIGS. 10-11. The pillar can be formed from ends of the superlattice structure or formed separately as, for example, one or more conductive material layers, such as GaN or some other conductive material.

Although the present example is illustrated with respect to employing a layer of AlGaN overlying a layer of GaN for each heterostructure, a variety of heterostructures could be employed as long as the heterostructure comprises two layers of dissimilar materials designed to create a sheet of electrons (i.e. a 2DEG channel) or a sheet of holes (i.e., a 2DHG channel) at the interface between the two dissimilar materials. Various heterostructure materials are known to produce 2DEG and 2DHG channels at the interface therebetween, including but not limited to Aluminum Gallium Nitride (AlGaN) and Gallium Nitride (GaN), Aluminum Gallium Arsenide (AlGaAs) and Gallium Arsenide (GaAs), Indium Aluminum Nitride (InAlN) and Gallium Nitride (GaN), alloys of Silicon (Si) and Germanium (Ge), and noncentrosymmetric oxidesheterojunction overlying a base structure.

The bottom surface of the wrap around gate 20 overlies a base structure 12. The base structure 12 can comprise a base layer 14, a nucleation layer 16 and a buffer layer 18 of, for example, silicon carbide (SiC), aluminum nitride (AlN) and aluminum gallium nitride (AlGaN), respectively. Optionally, the base structure 12 can comprise a base layer 14 of sapphire, a nucleation layer 16 comprising a combination of a low-temperature GaN layer and a high-temperature GaN layer, and a buffer layer 18 based on the material of the superlattice structure to be located thereon, if required. The base structure 12 can alternatively comprise a base layer 14 of (111)-orientated crystalline silicon, a nucleation layer 16 comprising AlN and a buffer layer 18 comprising a series of discrete AlGaN layers (typically between two and eight layers), each discrete layer having a different aluminum composition. Other base structures will be apparent to those skilled in the art.

Although the superlattice structure ridges 28 are each illustrated as having 4 heterostructures, the superlattice structure ridges 28 can comprise a plurality of heterostructures, between 2 and N, wherein N is defined as the maximum number of heterostructures that can be grown, deposited or otherwise formed on each other without cracking or other mechanical failure in the layers or 2DEG channels. As will be appreciated by one skilled in the art, the value of N is a function of the specific heterostructure materials and thickness of each layer. The specific number of heterostructures within the superlattice structure and the heteromaterials can vary, and the relative positions of AlGaN and GaN may be reversed, as will be appreciated by one skilled in the art.

The percentage of aluminum in the AlGaN layers 34 can range from about 0.1 to 100 percent. For example, the percentage of aluminum in the AlGaN layers can be between about 20% and 100% aluminum-content aluminum gallium nitride. The AlGaN layers can be graded or non-graded. In one example embodiment, each AlGaN layer within the is graded, the term "graded" being used to denote the process of gradually changing the percentage of aluminum to its specified percentage, relative to the percentage of gallium, as known in the art.

During the deposition, growth or other formation process of each AlGaN layer 28, a delta doping of an n-type dopant such as silicon (Si) can be added at the beginning of each of such AlGaN layers by introducing the dopant gas for a brief time interval, allowing the delta-doping for a confined thickness within the AlGaN layers to induce a 2DEG channel within each heterostructure. Similarly, a p-type dopant such as magnesium (Mg) would be introduced to induce a 2DHG channel in relevant heterostructures, as applicable. Other n-type and p-type dopants will be apparent to those skilled in the art. In one example, the delta-doping concentration is preferably between about 1 E17 $cm^{-3}$ and about 1 E20 $cm^{-3}$. Other delta-doping concentrations will be apparent to those skilled in the art.

It is to be appreciated that in a single heterostructure, the dissimilar materials cause an imbalance stress in the system which allows polarization and/or piezoelectric effects to induce carriers to form in a potential well formed by the heterostructure, i.e., to create a 2DxG channel. However, in a superlattice structure where multiple heterostructures are stacked on top of each other, all heterostructures beneath the top heterostructure will become balanced and carriers that would otherwise induce in those potential wells will not be induced. Adding a doping layer near the interface where the potential well is formed will act to induce the carriers into that potential well, replacing the effect that would have occurred but for the balancing effect of multiple symmetric heterostructures.

Turning now to FIGS. 3-14, an example fabrication is discussed in connection with formation of the example AAGFET device structure 10 as illustrated in FIGS. 1-2. FIG. 3 illustrates a cross-sectional view of an epitaxial structure in its early stages of fabrication. The epitaxial structure includes a sacrificial layer 58 overlying a base structure 50. The epitaxial structure further includes a superlattice structure 60 overlying the sacrificial layer 58. As stated above, the base structure 50 can comprise a base layer 52, a nucleation layer 54 and a buffer layer 56 formed of a variety of different materials as described above. The sacrificial layer 58 is formed of a material that can be etched away by an etchant at a substantially faster rate than the materials of the superlattice structure 60 and underlying base structure 50 to form undercut openings beneath the channel material of the superlattice structure 60 in which a gate contact material can be deposited to contact a bottom surface of each multichannel ridge, thus forming multichannel bridges. In one example, the sacrificial layer is formed from Indium Gallium Nitride (InGaN) or other Indium based alloy of GaN. This can be selectively removed under the superlattice structure employing a wet etch and/or employing a photoelectrochemical (PEC) process.

The superlattice structure 60 is formed from a plurality of heterostructures of an AlGaN layer 62 overlying a GaN layer 64. Any suitable technique for depositing each layer can be employed such as metal organic chemical vapor deposition (MOVCD), molecular beam epitaxy (MBE), Low Pressure Chemical Vapor Deposition (LPCVD), Plasma Enhanced Chemical Vapor Deposition (PECVD), High Density Chemical Plasma Vapor Deposition (HDPCVD), Atomic Layer Deposition (ALD), physical vapor deposition or high density plasma chemical vapor deposition (HDPCVD) techniques, or other suitable deposition techniques. Not shown are a first pillar and a second pillar that would be in front and behind the cross-sectional view of FIG. 3. The first and second pillar can be formed from a conductive material deposited before or after the superlattice structure 60 by deposition and lithography techniques, or be formed from the superlattice structure 60 itself.

Figure 4:
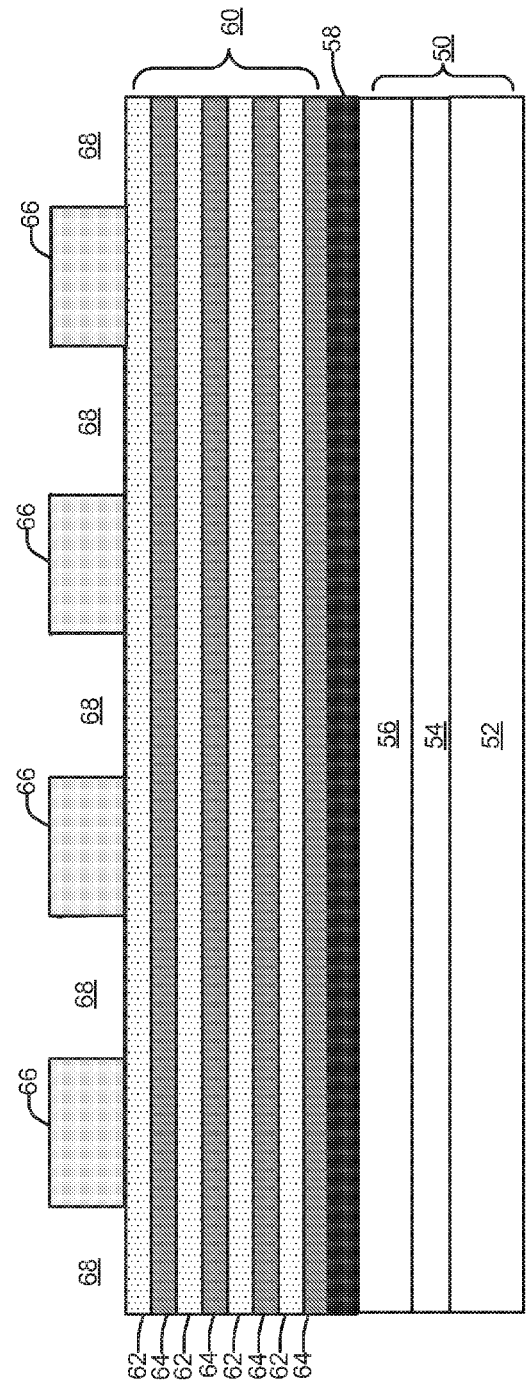
FIG. 4 illustrates a cross-sectional view of the structure of FIG. 3 after formation of an etch mask.
Figure 7:
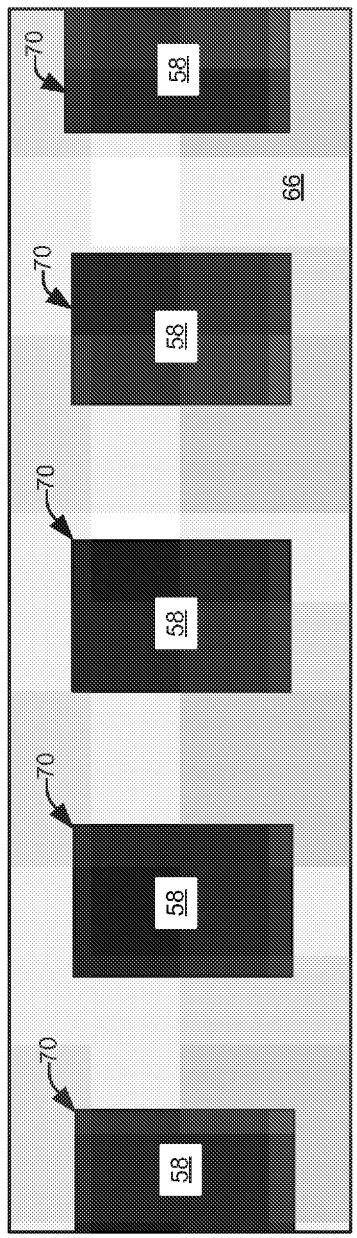
FIG. 7 illustrates a cross-sectional view of the structure of FIG. 6 after the first etch process.

Next as illustrated in the cross-sectional view of FIG. 4, a hard etch mask 66 is formed over the superlattice structure 60. A plan view of the hard etch mask 66 is shown in FIG.

5. The hard etch mask 66 can be formed by depositing, patterning and developing a photoresist material layer over the superlattice structure 60, depositing a hard mask material, such as for example, a thick layer of metal (e.g., nickel) or the like in the patterned openings, and then removing the photoresist material layer to leave a resultant hard mask. The hard mask 66 provides covered regions that protect underlying areas of the superlattice structure 60, where the multi-ridge multi channels will reside, and also covered regions that protect the source and drain regions that overly the first and second pillars, where the source and drain contacts will be formed. The hard mask also 66 includes trench openings 68 over the superlattice structure 60 exposing a top layer of AlGaN 62 for forming underlying castellated non-channel openings. Alternatively, a hard mask material such as an insulator material (e.g., silicon oxide ($SiO_2$), silicon nitride (SiN), etc.) can be deposited over the superlattice structure 60 followed by a depositing and patterning of photoresist material with a subsequent etching of the insulator material and stripping of the photoresist material to form the resultant hard mask 66.

Figure 8:
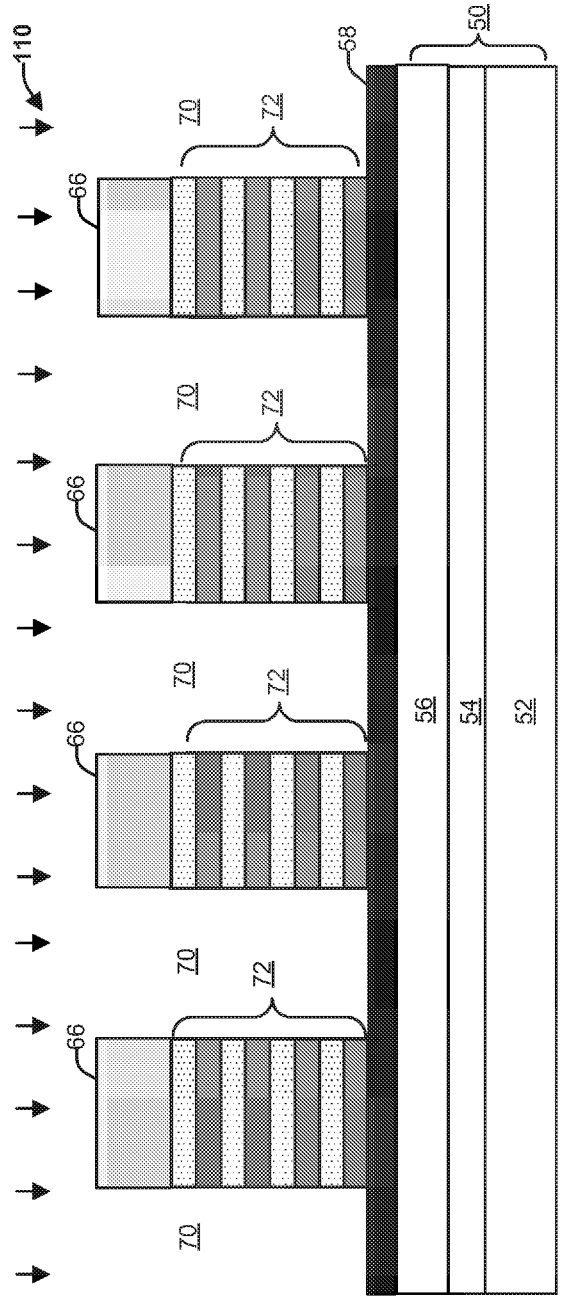
FIG. 8 illustrates a cross-sectional view of the structure of FIG. 7 undergoing a second etch process.

FIG. 6 illustrates performing of an etch 100 (e.g., anisotropic reactive ion etching (RIE)) on the structure of FIGS. 4 and 5 to remove portion of the superlattice structure under the openings 68 in the hard etch mask 66 for forming extended openings 70 (FIGS. 7-8) in the superlattice structure 60 down to the sacrificial layer 58. A plan view of the resultant structure is illustrated FIG. 7, and a cross-sectional view of the resultant structure is illustrated in FIG. 8. The etch step 100 can be a dry etch that employs an etchant which selectively etches the material of the supperlattice structure 60 at a faster rate than the underlying sacrificial layer 58 and the overlying hard etch mask 66. For example, the supperlattice 60 structure may be anisotropically etched with a plasma gas(es), herein carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern of the hard mask 66 to thereby remove portion of the superlattice structure 60 down to the sacrificial layer 58 leaving a plurality of multichannel ridges 72. The etching process 120 can include etching the channel region by an inductively coupled plasma (ICP) etcher to form "castellations" in the form of a plurality of multichannel ridges and non-channel openings.

FIG. 8 also illustrates performing of another etch 110 to remove portions of the sacrificial layer 58 to extend the extended openings 70 down to the base structure 50 to form extended openings 71 and to also form undercut openings 74 (FIGS. 9-10) in the sacrificial layer 58 underlying each of the plurality of multichannel ridges 72 to form a plurality of multichannel bridges 73 overlying the undercut openings 74. The etch step 110 can be a wet etch that employs an etchant which selectively etches the sacrificial layer 58 at a faster rate than the underlying base structure 50 and the overlying hard etch mask 66. In one example, the wet etch employs a potassium hydroxide solution (e.g., 1:3 solution of KOH:$H_2O$). The etch 110 can also be or include a photoelectrochemical (PEC) etching technique including but not limited to one or more of rapid, smooth, dislocation-selective, dopant selective and/or band-gap selective etching to form undercut openings 74 (as indicated by dashed lines) underneath the multichannel ridges 72 to form the multichannel bridges 73.

Figure 9:
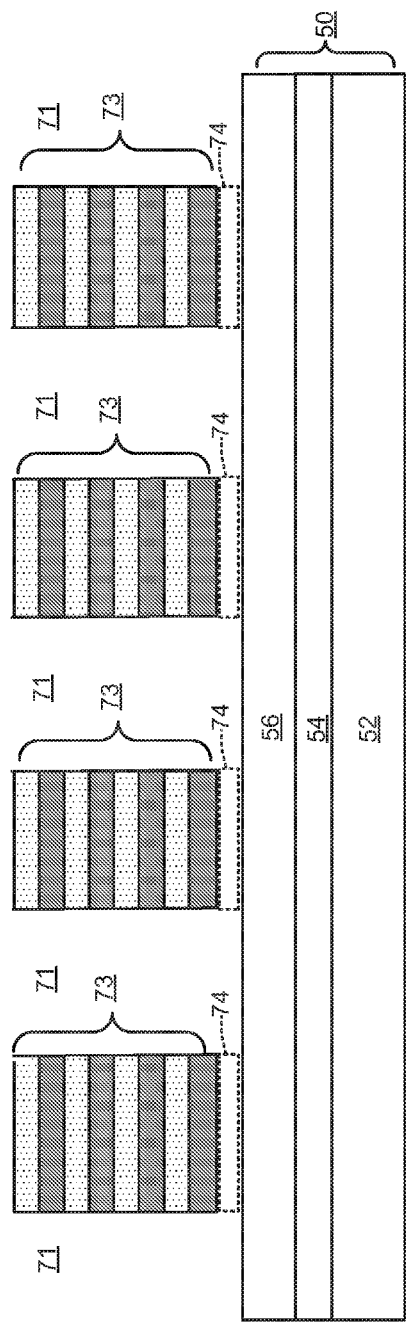
FIG. 9 illustrates a cross-sectional view of the structure of FIG. 8 after undergoing the second etch process.

The hard etch mask 66 is stripped to provide the resultant structure of FIG. 9 with undercut openings 74 underlying each the plurality of multichannel bridges 73. FIG. 10 is a plan view of the resultant structure of FIG. 9, while FIG. 11 is a right side view of the structure of FIG. 9. Both FIGS. 10-11 illustrate that each of the multichannel bridges 73 extends between a first pillar 76 in a drain region and a second pillar 77 in a source region. Both the first and second pillars 76 and 77 extend along the longitudinal length of the structure shown in FIG. 9. The first and second pillars 76 and 77 can be deposited before or after the superlattice structure 60 by deposition and lithography techniques, or be formed from the superlattice structure 60.

FIG. 12 is a plan view of the structure of FIGS. 9-11 after a photoresist material layer 78 is deposited, patterned and developed to form a longitudinal contact fill opening 80 that extends longitudinally over a central portion of the channel region for forming the all around gate contact. FIG. 13 provides a cross-sectional view of the structure of FIG. 11 undergoing a gate contact fill deposition 120 along the longitudinal opening 80 with a conductive material to form an all around gate contact 82 that wraps around and substantially surrounds all four sides of each of the plurality of multichannel bridges 73 along at least a portion of their lengths, as illustrated in FIG. 14. Optionally, a dielectric layer can be deposited that wraps around and surrounds all four sides of each of the plurality of multichannel bridges 73 along at least a portion of their lengths prior to the gate contact fill 140 to facilitate the reduction in leakage current by the resultant device structures. Alternatively, the gate contact material can be deposited over the entire structure and etched away everywhere but over the longitudinal opening 80. The gate contact fill deposition 120 can be an atomic layer deposition or other deposition technique conducive to depositing into trench openings and undercut openings. The gate contact 82 can be made of a conventional contact material comprising layers of nickel and gold, as known in the art. Other gate contacts compositions will be apparent to those skilled in the art. Subsequently or concurrently drain and source contacts can be formed, the photoresist material layer 78 can be stripped, and an overlying passivation layer deposited over the final structure to form the final integrated AAGFET device.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A device comprising:
  a first pillar disposed in a first region and overlying a base structure;
  a second pillar disposed in a second region and overlying the base structure and being spaced apart from the first pillar by a device region;
  a bridge disposed in the device region with a first end connected to the first pillar and a second end connected to the second pillar, the bridge having a top, sides, and a bottom, the bridge being formed from one or more heterostructures with an undercut opening extending from the bridge to an underlying structure; and
  a four-sided conductive contact that wraps around and substantially surrounds the bridge around its top, its sides and its bottom along at least a portion of its length between the first and second end.

2. The device of claim 1, wherein the bridge is a multichannel bridge formed from a plurality of heterostructures.

3. The device of claim 2, wherein the multichannel bridge is one of a plurality of multichannel bridges disposed in a longitudinally extending castellated region of the device region to provide alternating multichannel bridges and non-channel openings extending down to the base structure, wherein the four-sided conductive contact is a four-sided gate contact that wraps around and substantially surrounds each of the multichannel bridges and conductively connects each of the multichannel bridges to one another through the non-channel openings.

4. The device of claim 1, further comprising a source contact overlying the first pillar, and a drain contact overlying the second pillar.

5. The device of claim 1, wherein the one or more heterostructures comprises at least one layer of Gallium Nitride.

6. A transistor device comprising:
- a first pillar disposed in a drain region and overlying a base structure;
- a second pillar disposed in a source region and overlying the base structure and being spaced apart from the first pillar by a channel region;
- a multichannel bridge disposed in the channel region with a first end connected to the first pillar and a second end connected to the second pillar, the multichannel bridge being formed from a plurality of heterostructures with an undercut opening on a bottom of the plurality of heterostructures; and
- a four-sided gate contact that wraps around and substantially surrounds the multichannel bridge along at least a portion of its length.

7. The transistor device of claim 6, wherein the multichannel bridge is disposed in a castellated region in the channel region of alternating multichannel bridges and non-channel openings that extend to the base structure, wherein the four-sided gate contact wraps around and substantially surrounds each of the multichannel bridges and connects each multichannel bridge to one another through the non-channel openings.

8. The transistor device of claim 7, wherein the four-sided gate contact extends longitudinally across a central portion of the castellated region.

9. The transistor device of claim 6, further comprising a source contact overlying the first pillar, and a drain contact overlying the second pillar.

10. The transistor device of claim 6, further comprising a dielectric layer that wraps around and substantially surrounds each of the multichannel bridges along at least a portion of its length inside of the gate contact.

11. The device of claim 6, wherein each of the heterostructures comprises at least one layer of Gallium Nitride (GaN) stacked with at least one layer of Aluminum Gallium Nitride (AlGaN).

* * * * *